United States Patent [19]
Hong et al.

[11] Patent Number: 5,767,553
[45] Date of Patent: Jun. 16, 1998

[54] FLAT CELL MASK ROM HAVING COMPACT SELECT TRANSISTOR STRUCTURE

[75] Inventors: Gary Yeunding Hong; Chen-Chiu Hsue, both of Hsin-chu, Taiwan

[73] Assignee: United Microelectronics Corporation, Hsin-Chu, Taiwan

[21] Appl. No.: 647,645

[22] Filed: May 15, 1996

Related U.S. Application Data

[63] Continuation of Ser. No. 441,203, May 15, 1995, abandoned, which is a continuation of Ser. No. 160,246, Dec. 2, 1993, Pat. No. 5,453,392.

[51] Int. Cl.$^6$ ................................................. H01L 29/76
[52] U.S. Cl. .................... 257/387; 257/346; 257/391; 257/754
[58] Field of Search .................................. 257/390, 346, 257/387, 391, 754, 756; 365/104

[56] References Cited

U.S. PATENT DOCUMENTS

| | | |
|---|---|---|
| 4,028,717 | 6/1977 | Joy et al. |
| 4,078,947 | 3/1978 | Johnson et al. |
| 4,974,042 | 11/1990 | Ashida et al. ............................ 257/390 |
| 5,117,389 | 5/1992 | Yiu ............................................ 365/104 |
| 5,151,375 | 9/1992 | Kazerounian et al. ................... 437/43 |
| 5,202,848 | 4/1993 | Nakagawara ............................ 365/104 |
| 5,291,435 | 3/1994 | Yu ............................................ 365/104 |
| 5,318,921 | 6/1994 | Hsue et al. ................................. 437/52 |

OTHER PUBLICATIONS

Disclosed Figures 1 and 2.

*Primary Examiner*—J. Carroll
*Attorney, Agent, or Firm*—William H. Wright

[57] ABSTRACT

A method of manufacture for flat-cell Mask ROM devices on a silicon semiconductor substrate covered with a first gate oxide layer comprises, forming a first conductor structure on the first gate oxide layer, forming a buried conductive structure within the substrate by ion implantation with a portion thereof in juxtaposition with the first conductor structure, etching away the exposed surfaces of the first gate oxide layer exposing portions of the semiconductor, forming a second gate oxide layer on the surface of the semiconductor, and forming a second conductor structure on the second gate oxide layer.

7 Claims, 7 Drawing Sheets

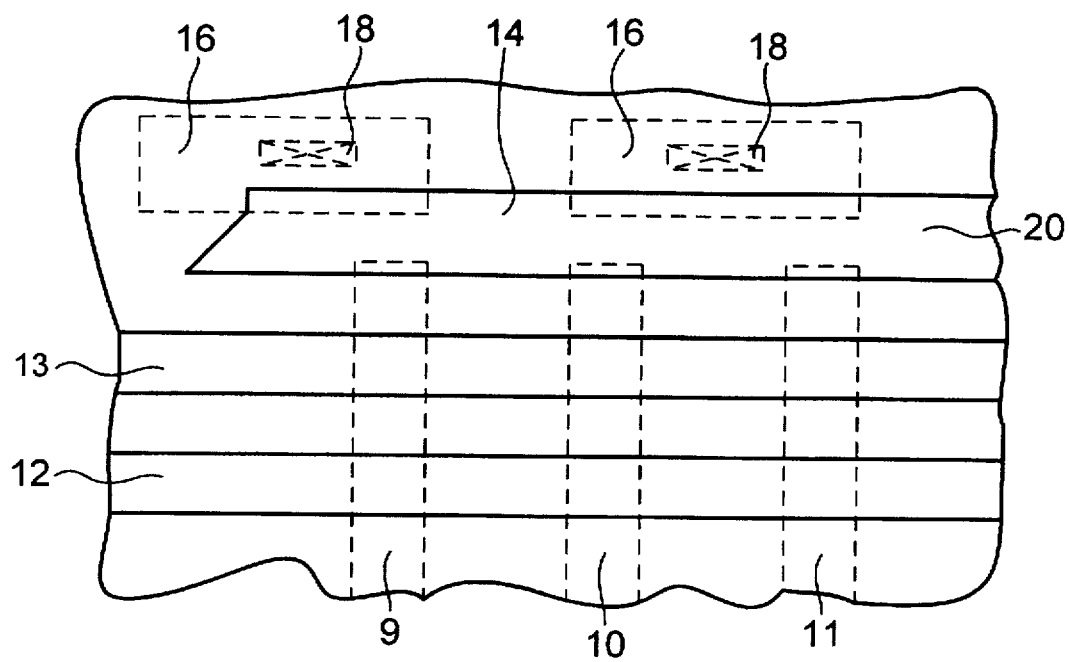
FIG. 1 - Prior Art
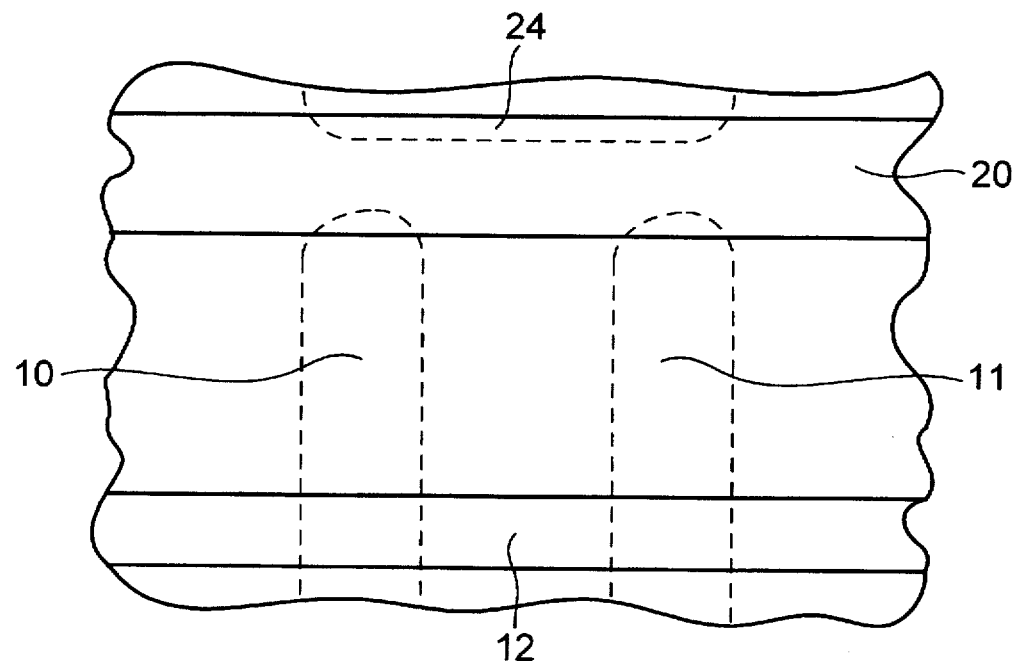
FIG. 2 - Prior Art

FLAT CELL MASK ROM HAVING COMPACT SELECT TRANSISTOR STRUCTURE

This is a continuation of application Ser. No. 08/441,203, filed May 15, 1995 and now abandoned, which was a continuation of application Ser. No. 08/160,246, now U.S. Pat. No. 5,453,392.

BACKGROUND OF THE INVENTION

1. Field of the Invention

This invention relates to flat-cell mask ROM's and more particularly to a process for manufacture thereof.

2. Description of Related Art

The current flat-cell (buried bit line) MASK ROM architecture employs a select transistor for every 16 or 32 bits to divide the memory array into a number of blocks as shown in FIG. 1. In FIG. 1, buried bit lines 9, 10, and 11, etc. extend vertically (on the page) and polysilicon word lines 12 and 13 extend horizontally (on the page), with the word lines 12 and 13 having with a rectilinear relationship to the bit lines. A polysilicon select word line 20 is provided for selecting transistors. A pair of buried N+ regions 16 are juxtaposed with the select word line 20. Region 16 and buried bit lines 9, 10, 11 form the source/drain for the selecting transistor. Metal lines will make contact to the contact opening in the region 16. Located centrally in the regions 16 are a pair of contacts 18. The separation of the array blocks can enhance the sensing speed. More importantly the use of select transistors allows the relaxation of metal pitch. (Two buried bit lines require one metal line.)

As shown in FIG. 2 which shows another aspect of the prior art, because a phenomenon known as "corner rounding" at the ends of lines 10 and 11 where they pass beneath the polysilicon select word line 20 resulting from use of photolithography, the polysilicon select word line 20 to buried N+ region 24 alignment process becomes very critical to reduce cell current being sensed through the select transistor. The problem of low yield has been found to be related to low cell current.

An object of this invention is to provide an improved process in which the mask ROM can be manufactured with no misalignment/corner rounding effect of the kind described above caused by use of the conventional process.

SUMMARY OF THE INVENTION

A method of manufacture for flat-cell Mask ROM devices on a silicon semiconductor substrate covered with a first gate oxide layer comprises, p1 a) forming a first conductor structure on the first gate oxide layer, p1 b) forming a buried conductive structure within the substrate by ion implantation with a portion thereof in juxtaposition with the first conductor structure, p1 c) etching away the exposed surfaces of the first gate oxide layer exposing portions of the semiconductor, p1 d) forming a second gate oxide layer on the surface of the semiconductor, and p1 e) forming a second conductor structure on the second gate oxide layer.

Preferably, the first conductor comprises a first polysilicon structure, and the second conductor comprises a second polysilicon structure; the buried conductors are formed by applying a mask over the substrate and the first conductor and depositing N+ ions into the substrate; the ions are implanted with a dose from about 1 E 15 atoms/cm² to about 5 E 15 atoms/cm² at an energy of from about 50 keV to about 100 keV in a high current implanter type of tool; and, the resultant dopant is within a concentration of from about $1\times10^{19}$ atoms/cm³ to about $5\times10^{19}$ atoms/cm³.

Preferably, the formation of the second conductor structure on the second gate oxide layer is performed by depositing a polysilicon layer on the second gate oxide layer, forming a mask on the polysilicon layer and etching the polysilicon layer through the mask.

BRIEF DESCRIPTION OF THE DRAWINGS

The foregoing and other aspects and advantages of this invention are explained and described below with reference to the accompanying drawings, in which:

FIG. 1 shows a prior art flat-cell (buried bit line) MASK ROM architecture employs a select transistor for every 16 or 32 bits to divide the memory array into a number of blocks.

FIG. 2 which shows another aspect of the prior art, involving the phenomenon known as "corner rounding" at the ends of lines where they pass beneath the polysilicon select word line resulting from use of photolithography.

DESCRIPTION OF THE PREFERRED EMBODIMENT

Figure 3:
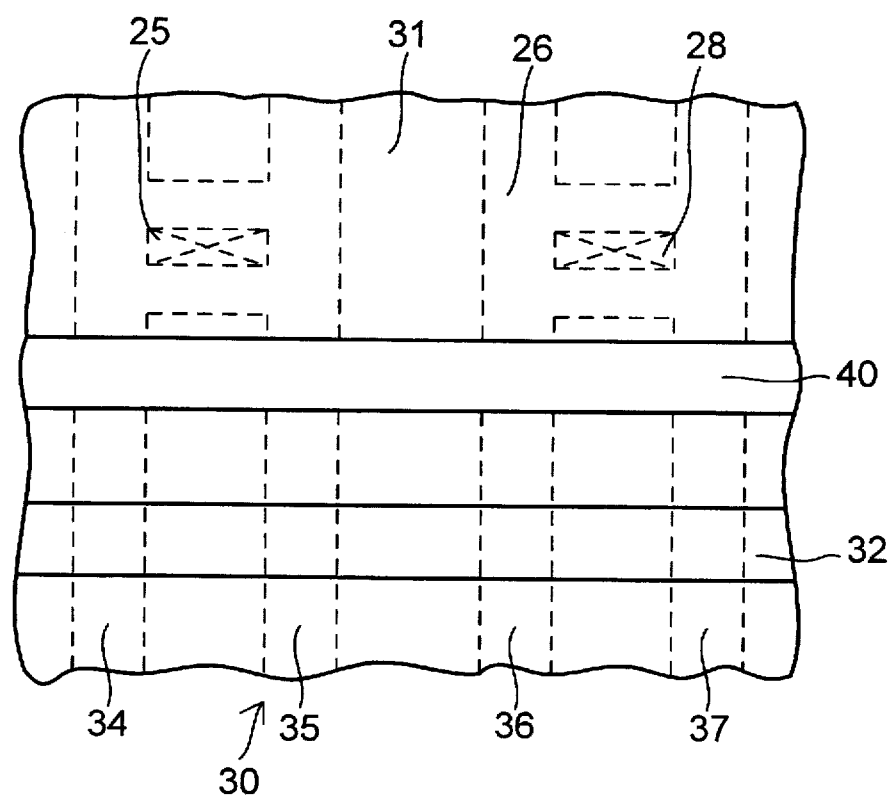
FIG. 3 shows a new layout of the MASK ROM cells formed in accordance with this invention.

FIG. 3 shows a new layout of the cells formed in accordance with this invention. There is again an array of parallel buried N+ bit lines 34, 35, 36 and 37 in the Psubstrate 31 composed of doped silicon of a semiconductor device 30. Buried N+ bit lines 34 and 35 are connected through a select transistor to the buried N+ region 27 and buried N+ bit lines 36 and 37 are connected through the select transistor to the buried N+ region 26. Contact region 25 and contact region 28 are located centrally in the source region 26 and drain region 27, respectively.

A polysilicon 1 conductor 40 comprising a word line for the select transistor passes between the ends of all of the lines 34, 35, 36 and 37 in and the regions 25 and 26. The next word line 32 of the memory cell is parallel to the line 40 and it is composed of polysilicon 2.

FIGS. 4A–4B, 5A–5C, 6A–6E illustrate a process for manufacture of a device in accordance with the design shown in FIG. 3.

Figure 4A:
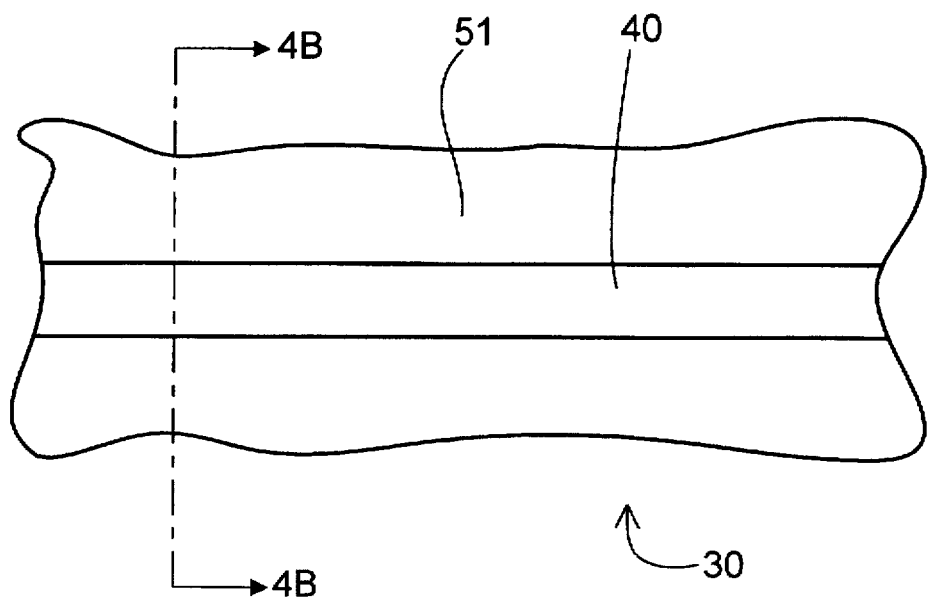
FIG. 4A–4B, 5A–5C, 6A–6E illustrate a process for manufacture of a device in accordance with the design shown in FIG. 3.

FIG. 4A shows a plan view of device 30 with the upper surface of a gate oxide 1 layer 51 formed on the surface of a semiconductor substrate 31 upon which the polysilicon 1 conductor 40 intended for use as a word line 40 for a select transistor has been formed.

Step 1

Figure 4B:
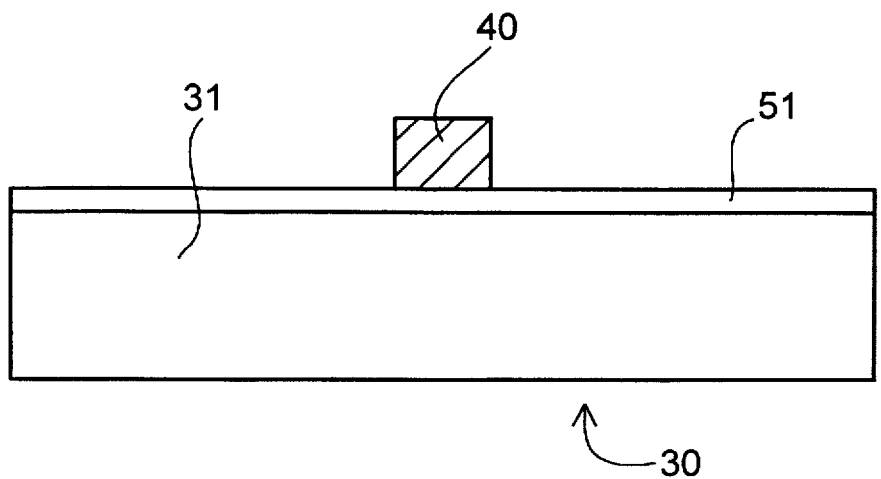

As shown in FIG. 4B, which is a section taken along line 4B—4B in FIG. 4A, in the first step of the process, the polysilicon 1 select transistor word line 40 is formed on a gate oxide 1 layer 51 which had been formed on substrate 31. Preferably, layer 51 is about100Å thick and line 40 is about 3000Å thick.

Figure 5A:
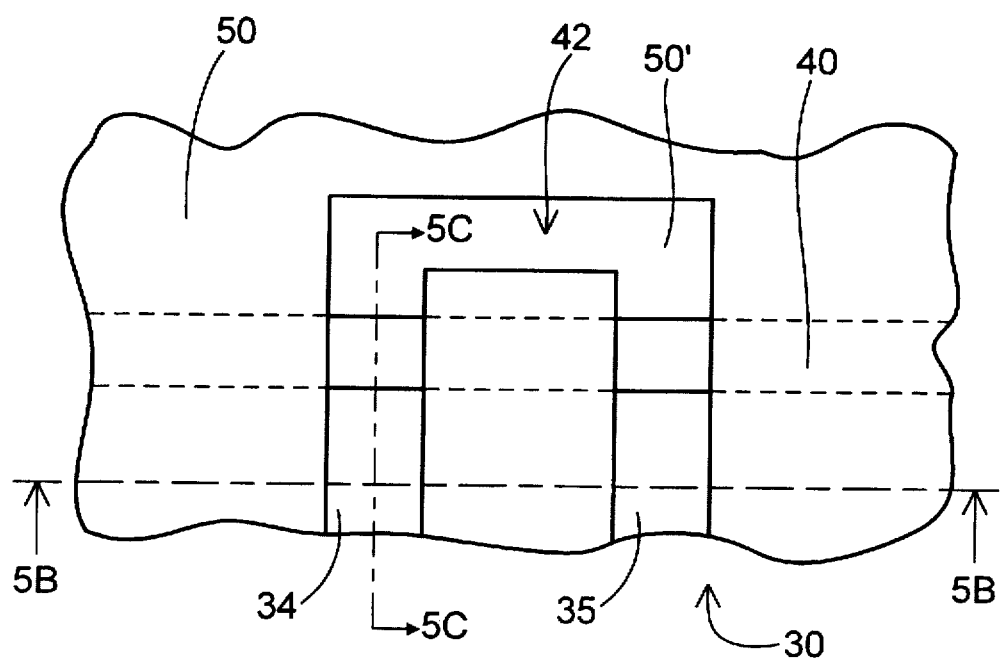

FIG. 5A shows the buried N+ ion implantation regions 34, 35 and 42 added to the product of FIG. 4A. Regions 34, 35 and 42 were formed by the process of application of a photolithographic mask 50 over line 40 and over gate oxide 1 layer 51.

Figure 5B:
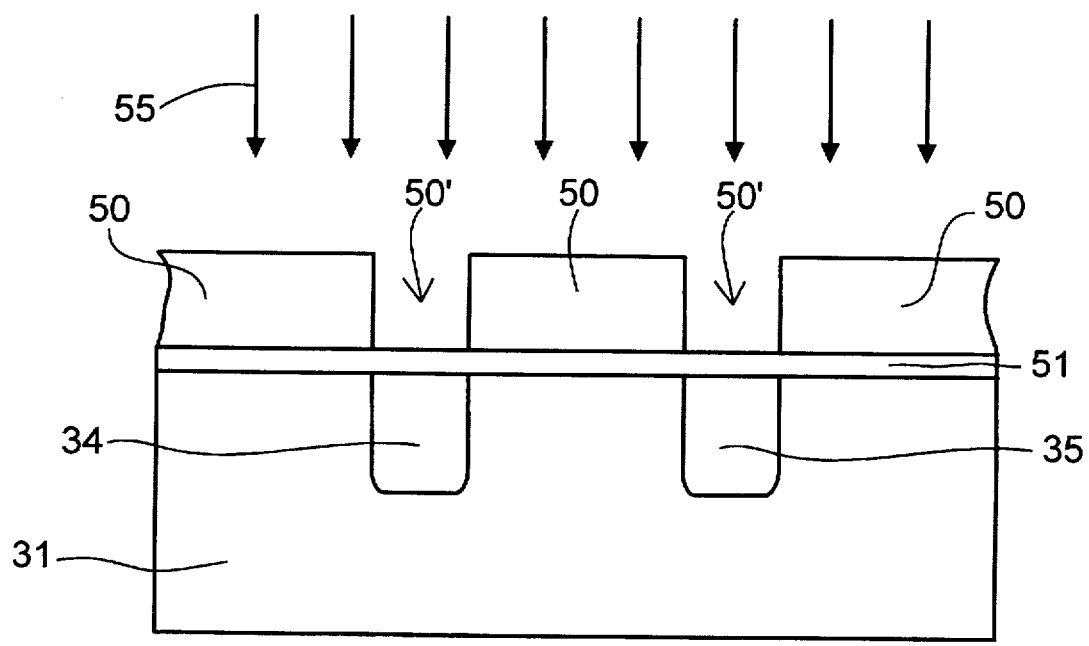

FIG. 5B shows a front elevational section of the structure of FIG. 5A with pattern 50' formed in mask 50 and ions 59 being implanted through the pattern 50' into the substrate 31 to form N+ regions 34, 35 and 42. In FIG. 5A, word line 40, which is parallel to buried bit line 42 is shown partially in phantom since it lies beneath the resist 50 except for the openings of pattern 50' therein.

Figure 5C:
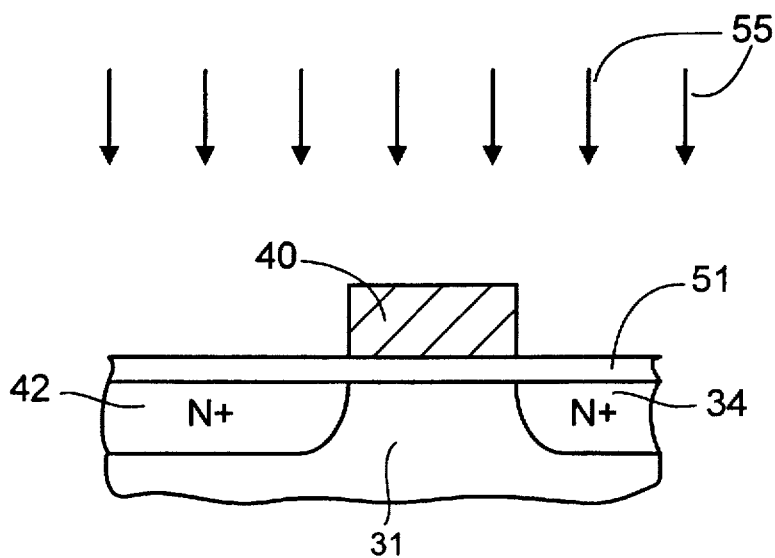

FIG. 5C shows a left elevational section taken along line 5C—5C in FIG. 5A through a portion of pattern 50', after the mask 50 has been removed.

Process Steps in FIGS. 5A–5C.

The process steps involved in FIGS. 5A–5C are as follows:

Step 2

A photolithographic resist layer is applied to gate oxide layer 51, exposed to a pattern and developed to form mask 50. Mask 50 has a pattern 50' therein for forming use when ion implanting the buried N+ bit lines 34, 35 and 41 within the substrate 31, beneath the surface of gate oxide 1 layer 51.

Step 3

An ion implantation step is performed with arsenic ions 55 deposited arsenic through pattern 50' in the mask 50, and the gate oxide layer 51, into the substrate 31 forming the buried N+ regions 34, 35, and 42 shown in FIG. 5A, 5B and 5C, (region 42 is seen only in FIG. 5A) which are exemplary of regions 26, 27, 34, 35, 36 and 37 in FIG. 3.

The chemical species of the N+ dopant 55 implanted is preferably arsenic (As) with a dose within an operable range of from about 1 E 15 atoms/cm$^2$ to about 5 E 15 atoms/cm$^2$ at an energy of from about 50 keV to about 100 keV in a high current implanted type of tool.

Step 4

The fourth step in the process of manufacture of the device of FIG. 3 is stripping of the photolithographic resist mask 50, producing the resulting structure shown in FIG. 5C, which is a section taken along line 5C—5C in FIG. 5A.

Figure 6A:
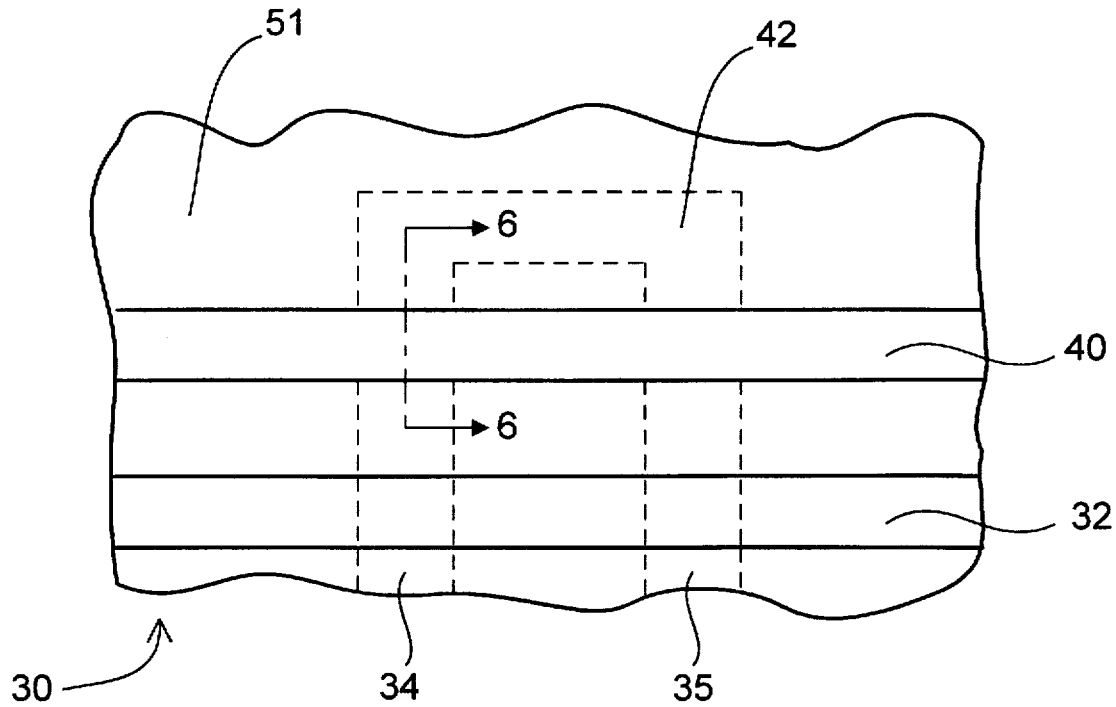

Referring to FIG. 6A, the plan view of a portion of the device is shown after the formation of a new polysilicon word line 32, which is formed in accordance with the process steps shown in FIGS. 6B–6E, with the buried bit lines 34, 42 and 35 shown in phantom beneath the surface of gate oxide 1 layer 51.

Step 5

Figure 6B:
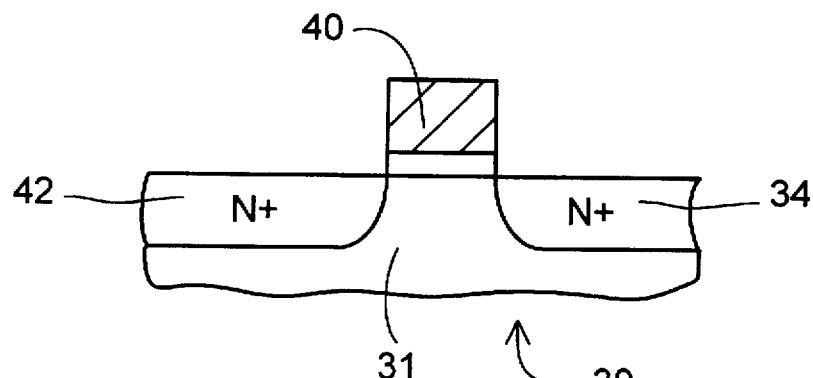
Figure 6C:
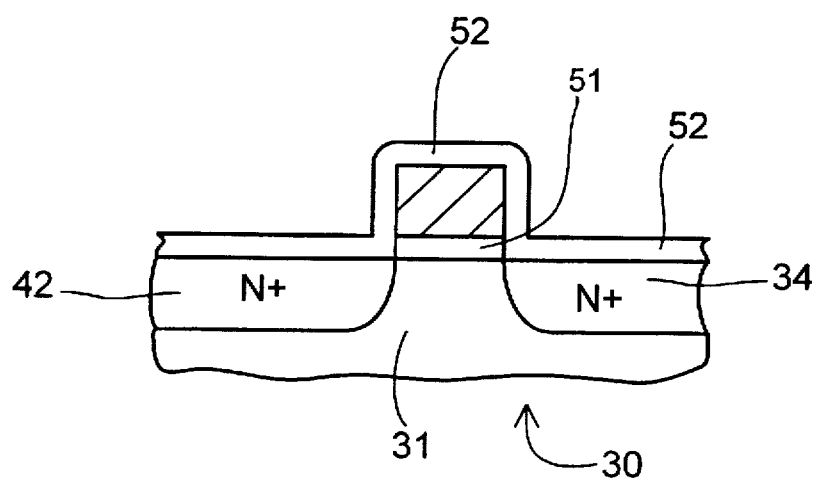

In step five, as shown in FIG. 6B, the first level of gate oxide, gate oxide 1 layer 51 is now etched away, except under line 40, using a conventional process such as dilute hydrogen fluoride (HF) solution.

Step 6

Next, in step six, a new gate oxide 2 layer 52 about 100Å thick is formed by oxidation of the silicon in substrate 31 by thermal oxidation covering the exposed surface of substrate 31 including bit lines 34, 35 and 42, as well as word line 40.

Step 7

Figure 6D:
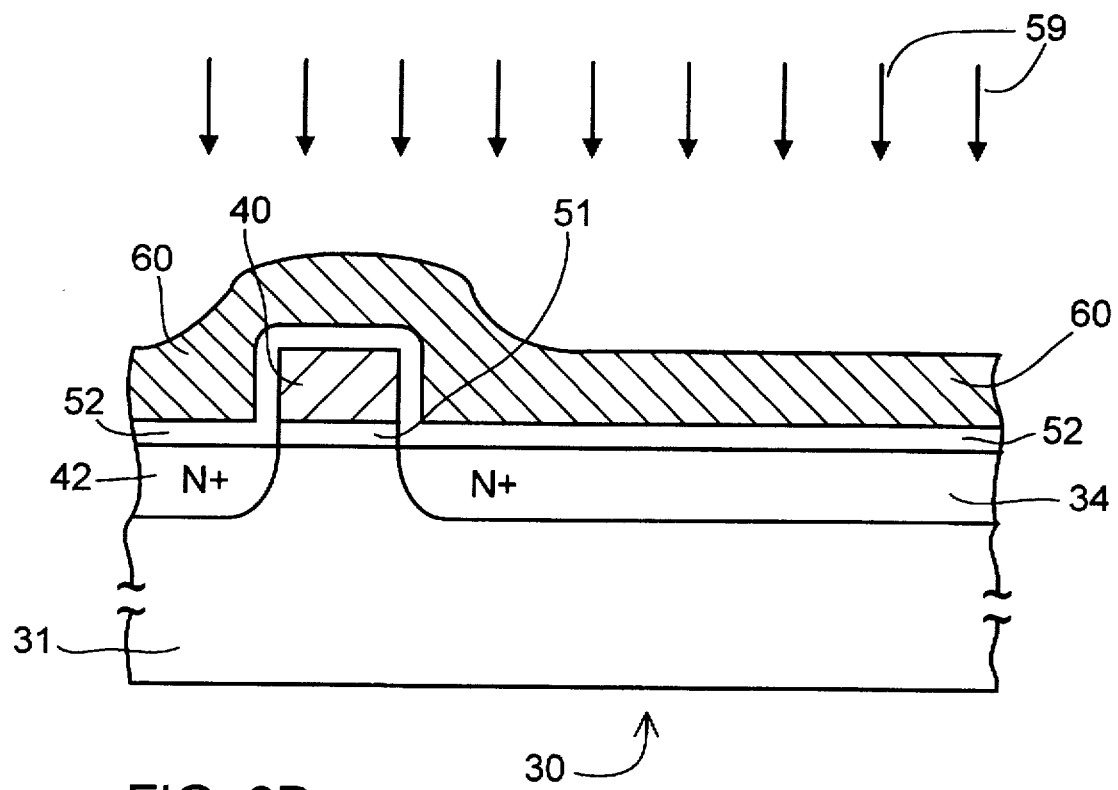

In step seven, as shown in FIG. 6D blanket deposition of polysilicon 2 layer 60 is formed using a conventional process. The polysilicon 2 layer 60 is doped by means of POCl$_3$ diffusion or ion implantation with ions 59 of P or As.

Step 8

Figure 6E:
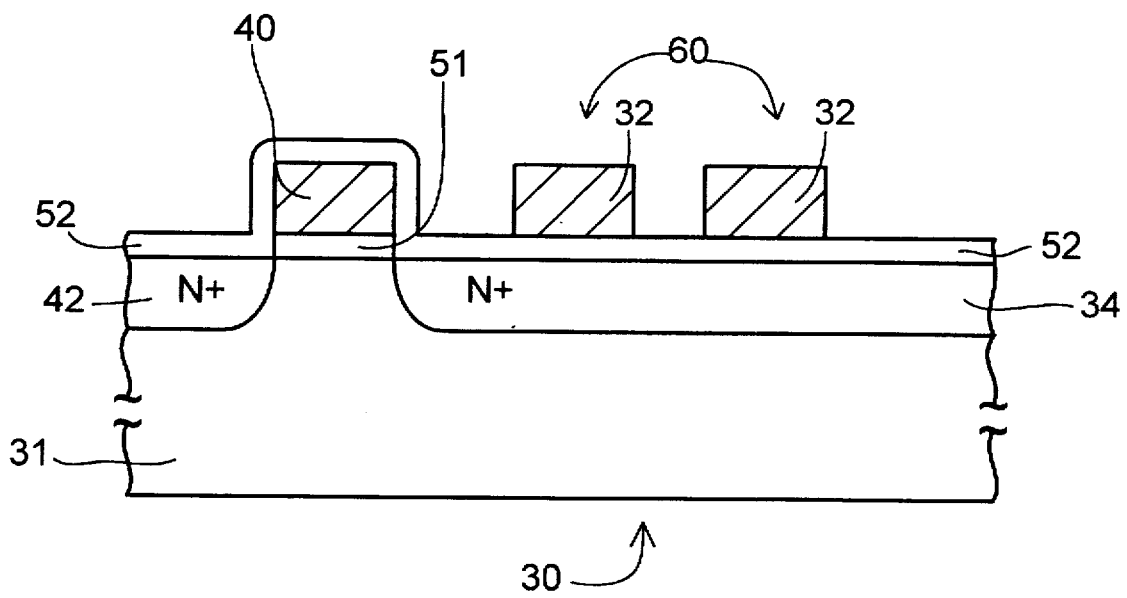

In step eight, as shown in FIG. 6E, the polysilicon 2 layer 60 of FIG. 6D is formed into word line 32 of FIG. 3 and word line 32' (not shown in FIG. 3.) Lines 32 and 32' are formed by etching the polysilicon 2 layer 60 with plasma etching employing a conventional method, well understood by those skilled in the art.

The balance of the process of forming the device is conventional as will be well understood by those skilled in the art.

Note that the polysilicon 1 word line can be used also as a peripheral gate, in which buried N+ implantation can serve as the N+ S/D implantation as well as the buried bit line.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by letters patent is as follows:

1. A mask ROM comprising:
   a semiconductor substrate;
   an array of parallel bit lines within the semiconductor substrate, including first, second, third and fourth bit lines each bit line having a first end;
   first and second doped contact regions formed in the semiconductor substrate; and
   a select word line extending perpendicular to the array of parallel bit lines, the word line comprising a first gate for a first select transistor disposed between the first end of the first bit line and the first doped contact region, the first bit line acting as a source or drain region for the first select transistor and the first doped contact region acting as a source or drain region for the first select transistor, wherein the first end of the first bit line is self-aligned to an edge of the select word line.

2. The mask ROM of claim 1, wherein the select word line comprises a second gate for a second select transistor disposed between the first end of the second bit line and the first doped contact region, the second bit line acting as a source or drain region for the second select transistor and the first doped contact region acting as a source or drain region for the second select transistor, wherein the first and second bit lines are immediately adjacent within the array of parallel bit lines.

3. The mask ROM of claim 2, wherein the select word line comprises a third gate for a third select transistor disposed between the first end of the third bit line and the second doped contact region and the select word line comprises a fourth gate for a fourth select transistor disposed between the fourth bit line and the second doped contact region.

4. The mask ROM of claim 3, wherein the first ends of the second, third and fourth bit lines are self-aligned to the edge of the select word line.

5. The mask ROM of claim 3, wherein the select word line comprises polysilicon.

6. The mask ROM of claim 2, wherein an edge of the first doped contact region is self-aligned to an opposite edge of the select word line.

7. The mask ROM of claim 1, further comprising:
   an array of parallel memory word lines extending in a direction perpendicular to the array of parallel bit lines;
   a first gate oxide layer between the select word line and the semiconductor substrate; and
   a second gate oxide layer between the array of parallel memory word lines and the semiconductor substrate, the second gate oxide layer extending over the select word line.

* * * * *